(12) United States Patent
Schleifer (10) Patent No.: US 12,283,789 B2
(45) Date of Patent: Apr. 22, 2025

(54) ELECTRONICS DRIVER FOR PULSED DISCHARGE (71) Applicant: Omron Corporation, Kyoto (JP)

(72) Inventor: Fred Freybler Schleifer, Spencer, NY (US)

(73) Assignee: Omron Corporation, Kyoto (JP)

( * ) Notice: Subject to any disclaimer, the term of this patent is extended or adjusted under 35 U.S.C. 154(b) by 552 days.

(21) Appl. No.: 17/623,189

(22) PCT Filed: Jul. 2, 2020

(86) PCT No.: PCT/US2020/040644
§ 371 (c)(1),
(2) Date: Dec. 27, 2021

(87) PCT Pub. No.: WO2021/003359
PCT Pub. Date: Jan. 7, 2021

(65) Prior Publication Data
US 2022/0360043 A1    Nov. 10, 2022

Related U.S. Application Data

(60) Provisional application No. 62/870,007, filed on Jul. 2, 2019.

(51) Int. Cl.
*H01S 3/00*    (2006.01)
*H01S 5/00*    (2006.01)
(Continued)

(52) U.S. Cl.
CPC ............ *H01S 5/005* (2013.01); *H01S 5/0057* (2013.01); *H01S 5/0428* (2013.01);
(Continued)

(58) Field of Classification Search
CPC ...... H01S 5/005; H01S 5/0057; H01S 5/0428; H01S 5/06817; H01S 5/06835; H01S 5/0261; H01S 2301/02; H01S 2301/08
See application file for complete search history.

(56) References Cited

U.S. PATENT DOCUMENTS 5,790,244 A  *  8/1998  Dunne ............ H03K 17/04166
                                                       250/214 R
5,895,984 A     4/1999  Renz
(Continued)

FOREIGN PATENT DOCUMENTS

CN    206116865 U     4/2017
JP    H4-279075 A    10/1992
(Continued)

OTHER PUBLICATIONS

Office Action received in Japanese Patent Application No. 2021-576440 as mailed Jan. 10, 2023 in 10 pages.
(Continued)

*Primary Examiner* — Kinam Park
(74) *Attorney, Agent, or Firm* — Knobbe, Martens, Olson & Bear, LLP (57) ABSTRACT

This application describes a laser driver that can include a voltage source, an inductor, at least one capacitor, a diode laser, and an electronic switch. The switch may be connected to ground and may be configured to alternate between an on state and an off state. In a first on state, current may flow through the switch to the inductor and through the inductor to store energy in the inductor. In a first off state, the inductor may release the stored energy and allow current to flow to the at least one capacitor to charge the at least one capacitor. In a second on state, the at least one capacitor may discharge and allow current to flow through the diode laser to cause the diode laser to emit light energy.

12 Claims, 5 Drawing Sheets

(51) Int. Cl.
*H01S 5/042* (2006.01)
*H01S 5/068* (2006.01)
*H01S 5/0683* (2006.01)
*H01S 5/026* (2006.01)

(52) U.S. Cl.
CPC ...... *H01S 5/06817* (2013.01); *H01S 5/06835* (2013.01); *H01S 5/0261* (2013.01); *H01S 2301/02* (2013.01); *H01S 2301/08* (2013.01)

(56) References Cited

U.S. PATENT DOCUMENTS

| | | | |
|---|---|---|---|
| 7,812,933 | B2 | 10/2010 | Jensen et al. |
| 2003/0016711 | A1 | 1/2003 | Crawford |
| 2009/0279069 | A1* | 11/2009 | Jensen .................. G01S 7/4814 356/5.1 |
| 2011/0085576 | A1 | 4/2011 | Crawford et al. |
| 2014/0063593 | A1 | 3/2014 | Berendt |
| 2014/0204396 | A1* | 7/2014 | Giger ........................ H03K 3/57 372/38.03 |
| 2014/0361145 | A1 | 12/2014 | Vogler et al. |
| 2017/0085057 | A1* | 3/2017 | Barnes .................. H01S 5/0428 |
| 2017/0163007 | A1 | 6/2017 | Stiffler et al. |
| 2018/0261975 | A1* | 9/2018 | Pavlov .................. G01S 7/4816 |
| 2019/0025406 | A1* | 1/2019 | Krelboim ................ H01S 5/062 |
| 2020/0400785 | A1* | 12/2020 | Peretz ..................... G01S 7/484 |
| 2021/0021098 | A1* | 1/2021 | Kaymaksut ........... H01S 5/0428 |

FOREIGN PATENT DOCUMENTS

| | | |
|---|---|---|
| JP | H7-79042 A | 3/1995 |
| JP | H7-183603 A | 7/1995 |
| JP | 2009-301747 A | 12/2009 |
| JP | 2012-33541 A | 2/2012 |
| JP | 2016-503584 A | 2/2016 |
| JP | 2016-152336 A | 8/2016 |
| JP | 2017-28235 A | 2/2017 |

OTHER PUBLICATIONS

International Search Report in PCT/US2020/040644, dated Sep. 24, 2020, in 2 pages.
Written Opinion of the International Search Authority in PCT/US2020/040644, dated Sep. 24, 2020, in 7 pages.
Extended European Search Report for EP Application No. 20834620 dated Jun. 9, 2023 in 8 pages.

* cited by examiner

ELECTRONICS DRIVER FOR PULSED DISCHARGE

BACKGROUND

Field

Some embodiments disclosed herein relate to laser scanners or other optical devices, as well as the electronic components that produce electrical discharges therein.

Description

An automated system may include mobile and/or stationary robots used to perform various tasks for industrial automation. Automated systems may utilize one or more safety sensors or devices that detect, measure, analyze, and process various changes that occur on productions sites, such as changes in position, length, height, displacement, and appearance. The safety sensors may comprise laser scanners that are used electronics drivers that provide pulsed discharges.

SUMMARY

This application describes electronic laser drivers for producing a pulsed electrical discharge. A laser driver may include a voltage source, an inductor, at least one capacitor, a diode laser, and an electronic switch. The inductor may have first and second ends and be in electrical communication with the voltage source at the first end of the inductor. The at least one capacitor may have first and second ends and be in electrical communication with the second end of the inductor at the first end of the at least one capacitor. The diode laser may have first and second ends and be in electrical communication with the second end of the at least one capacitor at the first end of the diode laser. The second end of the diode laser may be in electrical communication with ground. The electronic switch may have a first end connected to a first node disposed between the second end of the inductor and the first end of the at least one capacitor. The switch may be connected to ground and may be configured to alternate between an on state and an off state. In a first on state, current may flow through the switch to the inductor and through the inductor to store energy in the inductor. In a first off state, the inductor may release the stored energy and allow current to flow to the at least one capacitor to charge the at least one capacitor. In a second on state, the at least one capacitor may discharge and allow current to flow through the diode laser to cause the diode laser to emit light energy.

Also disclosed are methods of emitting a pulsed optical emission in a laser scanner. The method may include causing, using a gate controller, a switch to enter a first on state for a first amount of time. The method may also include storing, during the first on state, energy in an inductor electrically coupled to a voltage source. The method may further include causing, using the gate controller, the switch to enter an off state for a second amount of time. The method may include releasing, during the off state, energy from the inductor to charge a capacitor. The capacitor may have a first end electrically coupled to the inductor and a second end electrically coupled to a laser diode. The method may include causing, using the gate controller, the switch to enter a second on state for a third amount of time. The method may include discharging, during the second on state, the capacitor. The method can include emitting, using the laser diode, a pulse of light having a defined width. The emitting of the pulse of light may be based at least in part on the discharging of the capacitor.

BRIEF DESCRIPTION OF THE DRAWINGS

Certain embodiments will be discussed in detail with reference to the following figures, wherein like reference numerals refer to similar features throughout. These figures are provided for illustrative purposes and the embodiments are not limited to the specific implementations illustrated in the figures.

DETAILED DESCRIPTION

Figure 1:
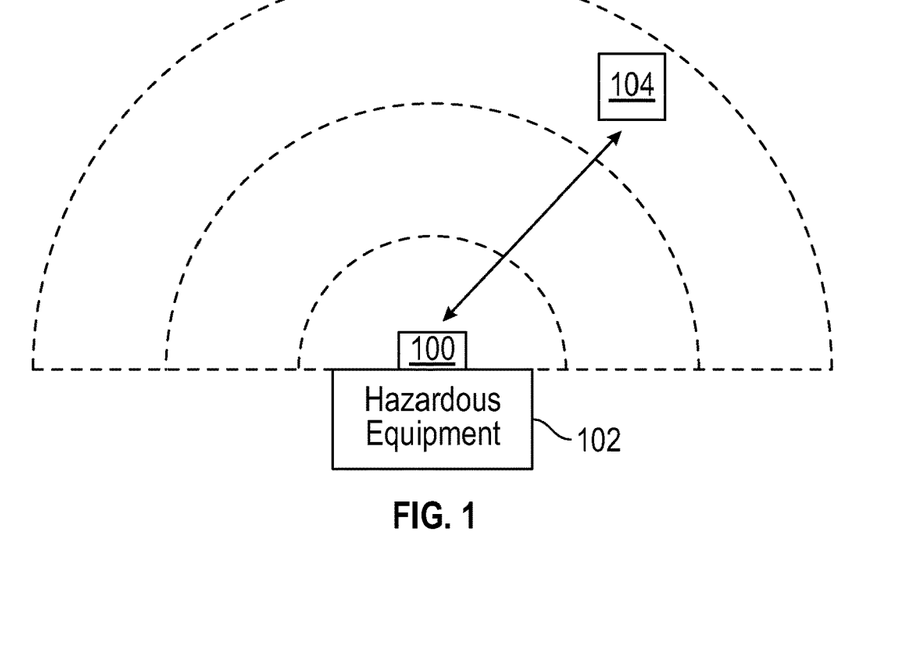
FIG. 1 shows an example embodiment of a laser scanner configured for guarding hazardous equipment.

Laser scanners or other systems for sensing the presence of an object and/or for measuring a distance to an object can be used in various applications, such as for guarding hazardous equipment (e.g., industrial machinery), for surveying, for security systems, for robot vision, robot guidance or pathfinding, etc. FIG. 1 shows a laser scanner 100 configured for guarding hazardous equipment 102 (e.g., such as industrial machinery). Although various examples are provided herein with relation to laser scanners for machine guarding, the features and concepts disclosed herein can be applied to various other contexts such as range finders, surveying equipment, light curtains, motion detectors, navigation systems, autonomous vehicles, etc.

As shown in FIG. 1, a laser scanner 100 can emit a pulse of light and/or receive light reflected from an object 104, which can be measured and used to determine that the object 104 is present. In some applications, the laser scanner 100 can send pulses of light in multiple directions so that the direction to the object can be determined. For example, the laser scanner 100 can step light pulses across an angular field of view, such as at sub-degree increments, although other increments or other configurations could be used, depending on the application. The laser scanner 100 can determine a distance to the object 104, such as by determining a time-of-flight for the light to travel to the object and then back to the laser scanner 100. For example, the distance to the object can be $\frac{1}{2} \cdot c \cdot t$, where c is the speed of light, and t is the time-of-flight. Using the direction and distance information, the location of the object 104 can be determined. Action can be taken in response to the determination of the location, direction, and/or distance of the object. For example, the hazardous equipment 102 can be stopped if an object 104 (e.g., a person) comes within a threshold distance, or an alarm or warning can be issued, etc.

Because light travels rapidly, the precision of the time-of-flight measurement can have a significant effect on the distance determination. For example, one nanosecond difference in the time-of-flight can result in a 150 mm difference in distance. Also, the resolution of the distance determination can depend on the sampling rate. For example, in certain implementations, a sampling period of 2 nanoseconds (e.g., sampling frequency of 500 MHz) can result in a native distance resolution increments of about 300 mm. According, in this example, the laser scanner would be able to determine the distance to the object in increments of about 300 mm. Increasing the sampling rate of the laser scanner 100 can be expensive. Various embodiments disclosed herein relate to upsampling to increase the effective sampling rate of the laser scanner 100 to thereby increase the resolution of the distance determination (e.g., in a cost effective manner).

Figure 2:
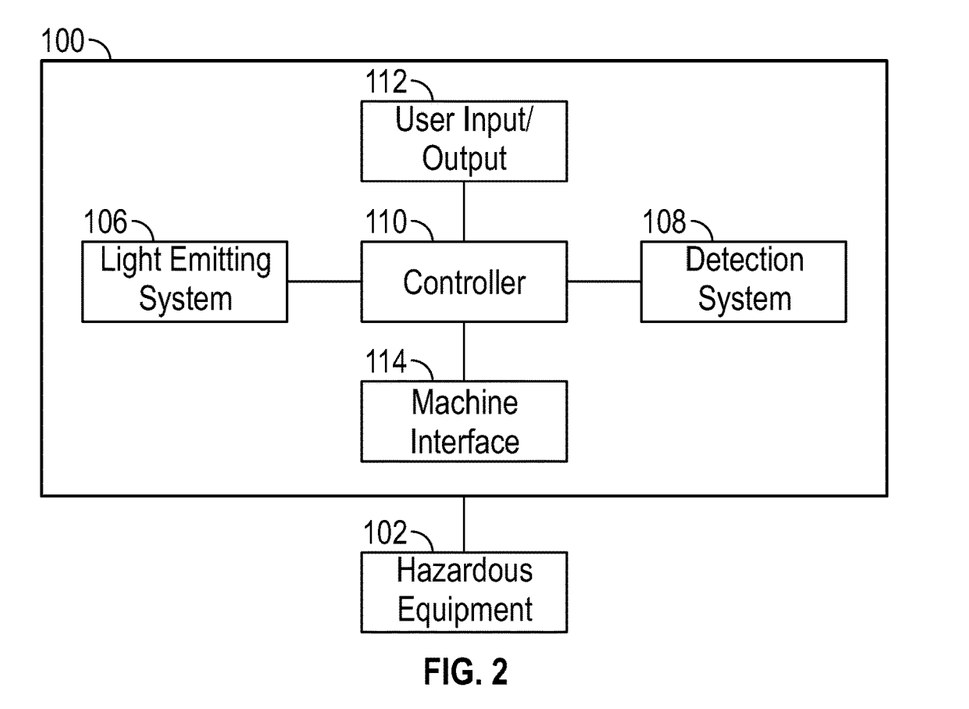
FIG. 2 is a block diagram showing components of an example embodiment of laser scanner.

FIG. 2 is a block diagram showing components of an example embodiment of laser scanner 100. The laser scanner 100 can have a light emitting system 106, which can be configured to emit light, such as by producing pulses of light. The light emitting system 106 can have a laser, such as a pulse laser that is configured to output discrete laser pulses. The duration of the light pulses (e.g., the laser pulse width) can also affect the resolution of the distance determination. For example, in some cases, increasing the actual receiver timing resolution (e.g., sampling rate) can have diminishing returns for increasing the distance resolution if the light pulses are not fast enough. Faster lasers, e.g., that produce laser pulses with shorter pulse widths, can often be expensive. However, some embodiments disclosed herein relate to a laser driver that can provide short pulse widths without high-voltage power supplies and/or complex driver circuits. Some embodiments disclosed herein relate to ADC-based receiver applications and may involve upsampling to effectively increase the sampling rate to increase the resolution of the distance measurement while using cost effective lasers and other components.

The laser scanner 100 can have a detection system 108 that can be configured to receive light of the laser pulses that is reflected from the object 104 back to the laser scanner 100. The laser scanner 100 can have a controller 110 configured to control operations of the laser scanner 100, as described herein. The controller 110 can include one or more hardware processors, and can execute instructions that are stored in computer-readable memory (e.g., in a non-transitory computer readable medium). The laser scanner 100 can have a machine interface 114, which can output instructions to corresponding hazardous equipment 102 (e.g., industrial machinery). For example, the laser scanner can stop the machinery or move the machinery to a safety configuration if an object (e.g., a person) is detected at a specified location or distance, etc. Other output signals can also be provided, such as for warning or alarms or data logging, etc.

The laser scanner can have input/output features 112. For example, user input elements (e.g., one or more buttons, dials, switches, microphone, etc.) can be used to receive input from a user. User output elements (e.g., one or more lights, speakers, display, printer, etc.) can be used to output information to a user. In some cases, user input and output elements can be combined, such as a touchscreen display. The input and output elements 112 can be used to configure, operate, and/or troubleshoot the laser scanner 100. The output elements 112 can provide direction, distance, and/or location information regarding an object. By way of example, the laser scanner 100 can have multiple lights can be selectively illuminated to indicate a direction of an object. Different colors or numerical values can be output to indicate a distance of a detected object from the scanner 100.

The laser scanner 100 can output a first color of light (e.g., green) for a safe condition (e.g., in which no object is determined to be in a dangerous location or range) and can output a second color of light (e.g., red) for a danger conduction (e.g., in which an object is determined to be in a dangerous location or range). Alternatives to the above-described features, as well as other features, of the laser scanner 100, may be utilized for particular task(s). Further, different types of electronic drivers may be used with the laser scanner 100 or component(s) thereof.

Figure 3:
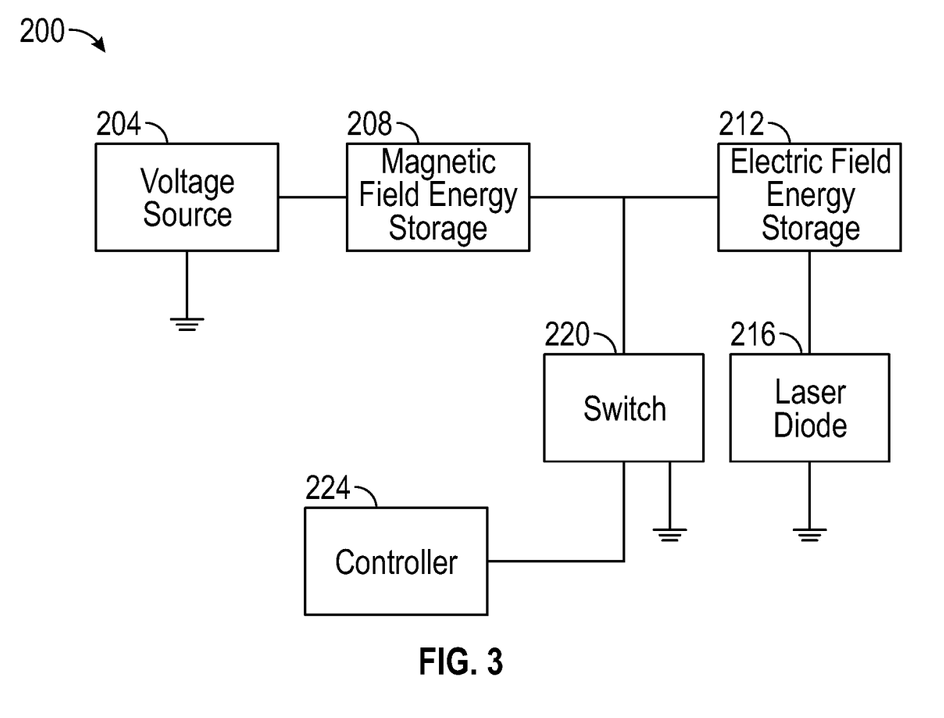
FIG. 3 shows a schematic of a type of driver that may be used with a laser scanner in accordance with aspects of the present disclosure.

In accordance with one or more aspects of the present disclosure, there are provided herein types of electronic drivers that may be used with optical devices (e.g., the laser scanner 100) and are configured to provide pulsed electrical discharges. FIG. 3 shows a schematic of a driver 200 that may be used in the laser scanner 100 described above. The driver 200 can include one or more components, such as a voltage source 204, a magnetic field energy storage 208, a electric field energy storage 212, a laser diode 216, a switch 220, and/or a gate controller 224. As shown, the voltage source 204 (e.g., a battery) may be electrically coupled to ground directly. In some embodiments, the voltage source 204 is coupled to ground via a node disposed between the voltage source 204 and the magnetic field energy storage 208.

The magnetic field energy storage 208 may comprise any electronic element configured to store energy in a magnetic field, such as, e.g., an inductor. The electric field energy storage 212 may comprise any electronic element configure to store energy in an electric field, such as, e.g., capacitor.

A first end of the electric field energy storage 212 may be in electrical communication with a second end of the magnetic field energy storage 208. The laser diode 216 may, at a first end thereof, be in electrical communication with a second end of the electric field energy storage 212. A second end of the laser diode 216 may be connected to ground.

A node may be disposed between the second end of the magnetic field energy storage 208 and the first end of the electric field energy storage 212. A first end of the switch 220 may be in electrical communication with the node, and a second end of the switch may be connected to ground. A controller 224 may be in electrical communication with a third end of the switch 220. Some configurations of the example driver 200 shown in FIG. 3 are described below.

Figure 4:
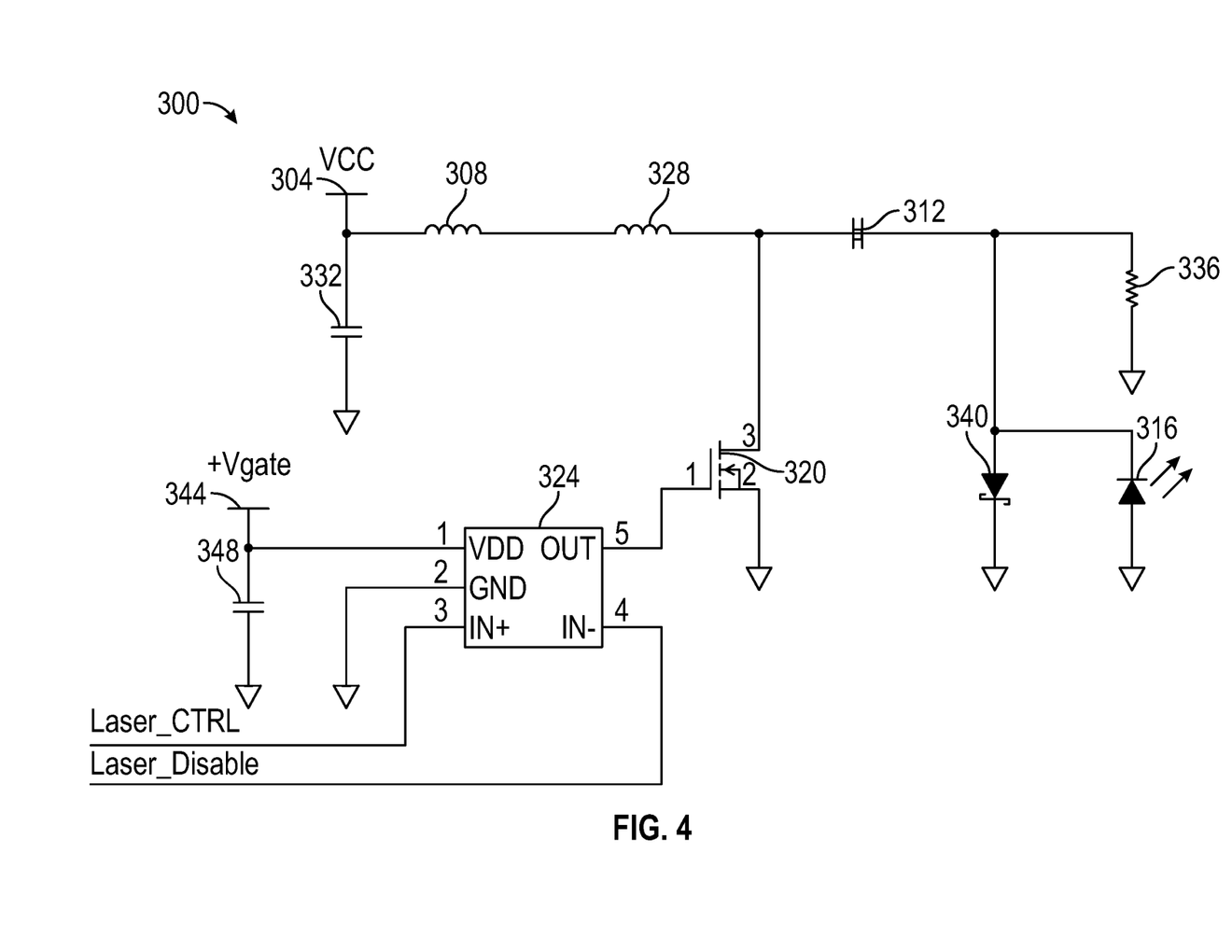
FIG. 4 shows an example driver that may have some of the features described with respect to the driver of FIG. 3.

FIG. 4 shows an example driver 300 that may have some of the functionality described with respect to the driver 200 of FIG. 3. The driver 300 can include a voltage source 304, an inductor 308, a capacitor 312, a laser diode 316, a switch 320, and/or a gate controller 324. Other components may be included, such as those described below. As shown, the voltage source 304 may be electrically coupled to ground and to the inductor 308. In some embodiments, the voltage source 304 is connected to a node that is connected to both ground and the inductor 308. The voltage source 304 may provide a voltage of between about 2 V and about 24 V and in some embodiments provides about 5 V. The node may be in electrical communication with a first end of the inductor 308 and/or with a capacitor 332 (see below). A second end of the inductor 308 may be in electrical communication with a first end of an electronic choke 328. The inductor 308 may have an inductance of between about 10 μH and about 1000 μH and in some embodiments is about 100 μH.

The electronic choke 328 can be configured to reduce noise at a certain range of frequencies, such as at high frequencies. The electronic choke 328 may include, for example, a ferrite bead. A first end of the capacitor 312 may be in electrical communication with a second end of the electronic choke 328. The electronic choke 328 may have an impedance of between about 20 mΩ and about 1000Ω at a frequency of 100 MHz, and in some embodiments the resistance (e.g., DC resistance) is about 500 mΩ. In some embodiments, the impedance is low enough to prevent a significant voltage drop relative to the supply voltage. Although shown in FIG. 4, some embodiments do not include an electronic choke 328. As with the other elements described herein, the capacitor 312 can include a plurality of electrical components, such as a plurality of capacitors arranged in parallel with each other. The laser diode 316 may, at a first end thereof, be in electrical communication with a second end of the capacitor 312. A second end of the laser diode 316 may be connected to ground, as shown.

In some embodiments, the driver 300 can include a second capacitor 332 that has a first end connected to a node disposed between the voltage source 304 and the first end of the inductor 308. The capacitor 332 can have a second end connected to ground. The capacitor 332 may be configured to reduce parasitic impedance of the voltage source 304, such as between laser pulses, power supply ripple, and/or to reduce the coupling of switching noise into the system power supply.

The driver 300 may include a resistor 336 that is in electrical communication with a node between the capacitor 312 and the laser diode 316. A first end of the resistor 336 may be electrically connected with the node. A second end of the capacitor 312 and a first end of the laser diode 316 may be electrically connected to the node. A first end of a diode 340 may be electrically connected to the node. In some embodiments, a second end of one or more of the resistor 336, the diode 340, and/or the laser diode 316 may be connected to ground. The laser diode 316 may emit visible light but in certain embodiments it is configured to emit infrared light. The laser diode 316 may be configured to emit light having a wavelength of between about 400 nm and about 2000 nm and in some embodiments is about 905 nm. The capacitor 312 may have a capacitance of between about 50 pF and about 2000 pF and in some embodiments is about 300 pF. The resistor 336 may have a resistance of between about 2Ω and about 200Ω and in some embodiments is about 20Ω. The resistor 336 can be configured to shape a laser pulse. For example, the resistor 336 may reduce a fall time of the laser pulse.

The diode 340 may be in electrical communication with the node connecting the capacitor 312 with the laser diode 316, as shown in FIG. 4. The diode 340 may be configured to prevent damaging reverse bias of the laser diode by supporting, for example, the charging current of the capacitor 312 flowing from inductor 308. In some cases, reverse laser bias can also occur shortly after each laser pulse. For example, the diode 340 may include a Schottky diode.

The switch 320 can be electrically connected to a node disposed between the inductor 308 (and/or the electronic choke 328) and the capacitor 312. A first end of the switch 320 can be in electrical communication with the node. The second end of the inductor 308 (and/or of the electronic choke 328) may be electrically connected to the node. The first end of the capacitor 312 may be electrically connected to the node. A second end of the switch 320 may be connected to ground.

A third end of the switch 320 may be connected to a controller 324. The controller 324 may be configured to control functionality of the switch 320. For example, the controller 324 may govern the timing of the switch 320, as described below. Accordingly, the laser pulse width may be based at least in part on the switch 320. A voltage source 344 may be connected to the controller 324 and may supply a current thereto. For example, the voltage source 344 may supply a voltage of between about 4 V and about 20 V. For example, the voltage source 344 may supply a voltage of about 16 V in some embodiments, but other voltages are possible. The supplied voltage may be significantly less than about 5 V in some embodiments, such as when a particular FET is used (e.g., a FET comprising gallium-nitride (GaN)). The FET may include a silicon power MOSFET, which may require higher voltages. A capacitor 348 may be connected to a node disposed between the voltage source 344 and the controller 324. The capacitor 348 may have a capacitance of between about 0.01 μF and about 100 μF and in some embodiments is about 0.1 μF. The controller 324 may be connected to a laser control system configured to control the pulse length of the laser pulse and/or to disable the laser.

Figure 5:
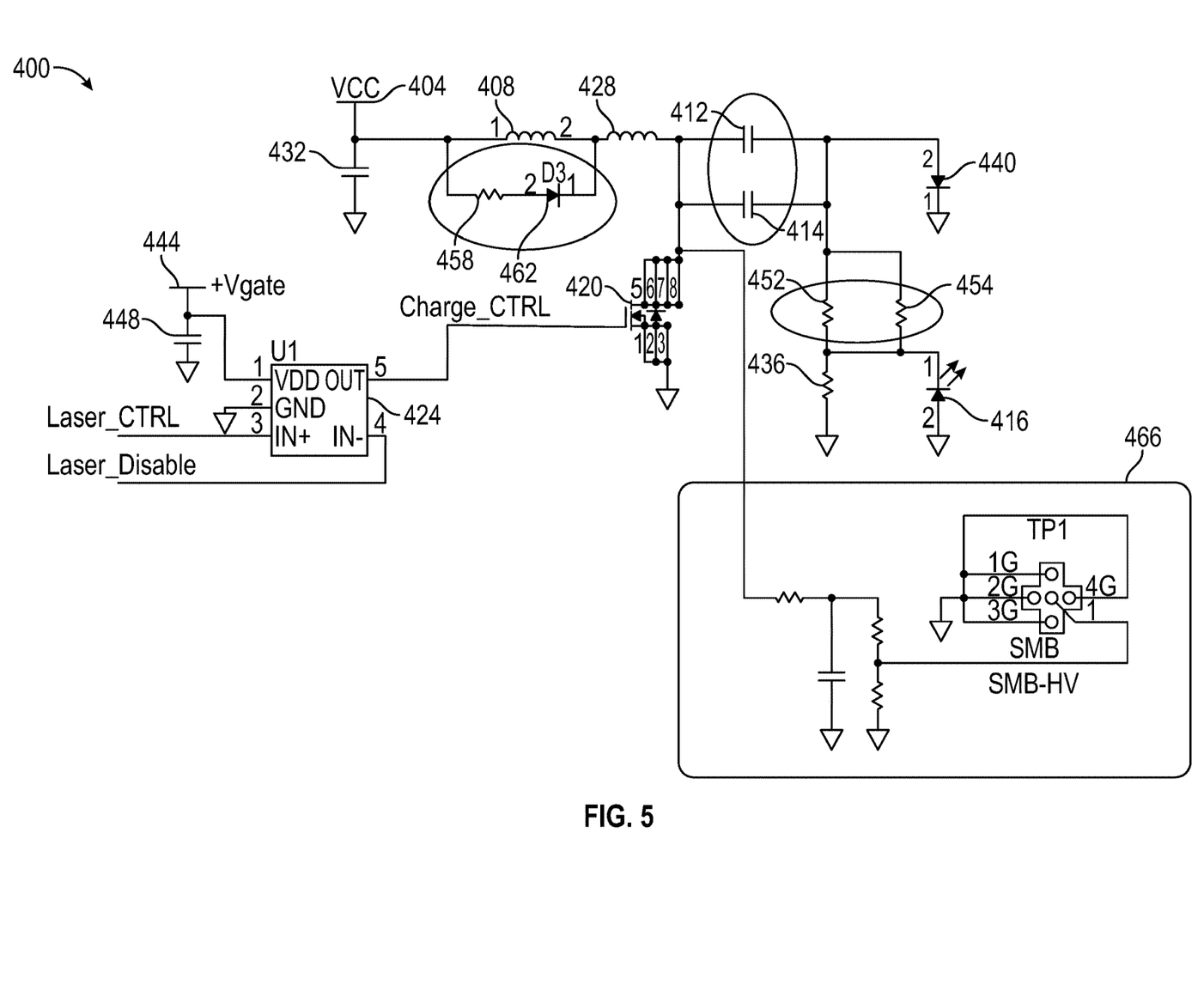
FIG. 5 shows another example driver that may have some of the features described with respect to the drivers of FIG. 3 or FIG. 4.

FIG. 5 shows another example driver 300 that may have some of the functionality described with respect to the driver 200 of FIG. 3 and/or to the driver 300 of FIG. 4. The driver 400 can include a voltage source 404, an inductor 408, a capacitor 412, a laser diode 416, a switch 420, a gate controller 424, a capacitor 432, a resistor 436, and/or a diode 440. Other components may be included, such as those described below. As shown, the voltage source 404 may be electrically coupled to a first node connected to a first end of the capacitor 432 and to a second node connecting parallel branches. The voltage source 404 may provide a voltage of between about 2 V and about 24 V and in some embodiments provides about 5 V. The second node may connect a plurality of branches. A first branch may include the inductor 408. The inductor 408 may have an inductance of between about 10 μH and about 1000 μH and in some embodiments is about 100 μH. A second branch may include one or more electrical components, such as a resistor 458 and/or a diode 462. The diode may be arranged to drive current away from the resistor 458. The resistor 458 may have a resistance of between about 50Ω and about 5000Ω and in some embodiments is about 499Ω. The plurality of branches may be arranged in parallel with each other and may connect at a third node. The resistor 458 and/or the diode 462 may be configured to reduce variation between pulses and/or to improve the pulse shape of the laser pulse. For example, the resistor 458 may be configured to reduce (e.g., damp) ringing of the inductor 408 and/or of one or more of capacitors 412, 414 (e.g., after a laser pulse). Additionally or alternatively, the diode 462 can be configured to reduce damping of the charging of one or more of the capacitor 412, 414.

The third node may be in electrical communication with a first end of an electronic choke 428. The electronic choke 428 can be configured to reduce noise at a certain range of frequencies, such as at high frequencies. The electronic choke 428 may include, for example, a ferrite bead. The electronic choke 428 may have an impedance of between about 20 mΩ and about 1000Ω at a frequency of about 100 MHz, and in some embodiments the impedance is about 500 mΩ.

A fourth node may be in electrical communication with a second end of the electronic choke 428. Parallel segments may run between the fourth node and a fifth node. Each segment may include a corresponding capacitor. For example, a first segment may include a first capacitor 412 and a second segment may include a second capacitor 414. One or more of the capacitors 412, 414 may have a have a total capacitance of between about 50 pF and about 2000 pF and in some embodiments is about 400 pF. One or more of the capacitors 412, 414 may be configured to reduce their parasitic inductance and/or may reduce the width of the laser pulse.

A first end of a diode 440 may be electrically connected to the fifth node. A second end of the diode 440 may be connected to ground. The diode 440 may be configured to prevent damaging reverse bias of the laser diode by supporting, for example, the charging current of the capacitors 412, 414 flowing from the inductor 408. In some cases, reverse laser bias can also occur shortly after each laser pulse. The diode 440 may include a Schottky diode.

Additionally or alternatively, parallel segments may run between the fifth node and a sixth node. Each segment may include a corresponding resistor. For example, a first segment may include a first resistor 452 and a second segment may include a second resistor 454. One or more of the resistors 452, 454 may have a have a resistance of between about $0.5\Omega$ and about $10\Omega$ and in some embodiments is about $3.9\Omega$. In some embodiments, the resistors 452, 454 are arranged in parallel with each other (e.g., with respect to the path between the voltage source 404 and the laser diode 416). The one or more of the resistors 452, 454 may be configured to reduce the fall time of the laser pulse (e.g., when in series with the laser diode 416) and/or reduce their parasitic.

The driver 400 may include a resistor 436 that is in electrical communication with the sixth node. The sixth node may be connected to a first end of the resistor 436 and a first end of the laser diode 416. The resistor 436 may have a resistance of between about $2\Omega$ and about $200\Omega$ and in some embodiments is about $20\Omega$. The resistor 436 can be configured to shape a laser pulse. For example, the resistor 436 may reduce a fall time of the laser pulse. In some embodiments, a second end of one or more of the resistor 436 and/or of the laser diode 416 may be connected to ground. The laser diode 416 may emit light (e.g., visible, infrared) as described above with respect to the laser diode 316.

The switch 420 can be electrically connected to the fourth node disposed between the electronic choke 428 and the parallel branches that include the capacitor 412 therein. A first end of the switch 420 can be in electrical communication with the fourth node. The first end of the capacitor 412 may be electrically connected to the fourth node. A second end of the switch 420 may be connected to ground.

A third end of the switch 420 may be connected to a controller 424. The controller 424 may be configured to control functionality of the switch 420. For example, the controller 424 may govern the timing of the switch 420, as described below. Accordingly, the laser pulse width may be based at least in part on the switch 420. A voltage source 444 may be connected to the controller 424 and may supply a current thereto. The voltage source 444 may supply a voltage of about 15 V in some embodiments, but other voltages are possible. A capacitor 448 may be connected to a node disposed between the voltage source 444 and the controller 424. The capacitor 448 may have a capacitance of between about 0.01 μF and about 100 μF and in some embodiments is about 0.1 μF. The controller 424 may be connected to a laser control system configured to control the pulse length of the laser pulse and/or to disable the laser.

A diagnostic component 466 may additionally or alternatively be connected to the fourth node. The diagnostic component 466 can be configured to provide readings of the functionality of the switch and/or other diagnostics (e.g., timings, length of various states, currents, voltages, etc.).

To achieve a laser pulse, the electronic switch (e.g., 220, 320, 420) may be configured to alternate between an on state and an off state. The switch may turn the driver to a first on state. In the first on state, current may flow through the switch and the inductor (e.g., 208, 308, 408) to store energy (e.g., magnetic energy) in the inductor. The switch may remain in the first on state for a first time period of between about 1 μs and about 10 μs. In some embodiments the first time period is about 6 μs.

Subsequent to the first on state, the switch may cause the driver to move into a first off state. In the first off state, the inductor may release the stored energy and cause current to flow to at least one capacitor (e.g., 212, 312, 412, 414) to charge (e.g., store electrical energy in) the at least one capacitor. The first off state may last for a second time period of between about 10 ns and about 1000 ns. In some embodiments the second time period is about 320 ns.

Subsequent to the first off state, the switch may cause the driver to move into a second on state. In the second on state, the at least one capacitor may discharge and cause current to flow through the diode laser (e.g., 216, 316, 416) to cause the diode laser to emit light energy (e.g., as a pulse of light). The second on state may last for a third time period of between about 5 ns and about 100 ns. In some embodiments the second time period is about 25 ns. A 25 ns trigger pulse is short enough to avoid generating unnecessary inductor current.

Figure 6:
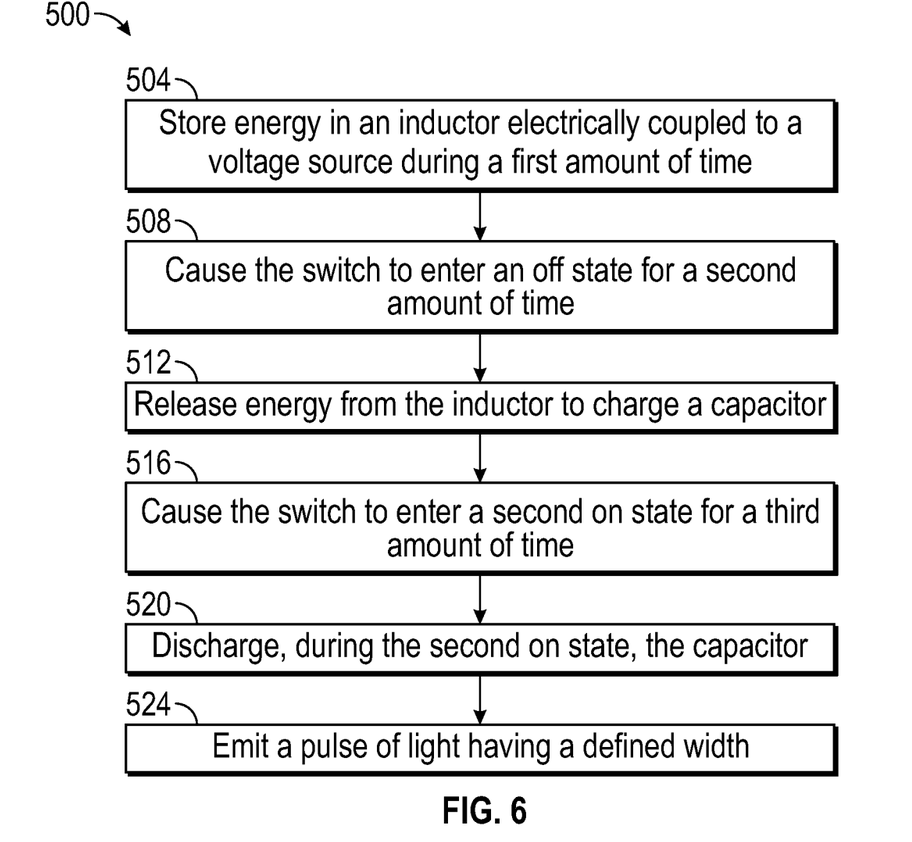
FIG. 6 is a flowchart showing an example embodiment of a method for operating a laser driver and/or for emitting a pulsed optical emission in a laser scanner, in accordance with aspects of the present disclosure.

FIG. 6 is a flowchart showing an example embodiment of a method 500 for operating a laser driver and/or for emitting a pulsed optical emission in a laser scanner, according to the descriptions herein. Various features disclosed herein are optional and can be omitted. At block 504, the method 500 can include causing, using a gate controller, a switch to enter a first on state for a first amount of time. At block 504, the method 500 can include storing, during the first on state, energy in an inductor electrically coupled to a voltage source.

At block 508, the method 500 may include causing, using the gate controller, the switch to enter an off state for a second amount of time. At block 512, the method 500 may include releasing, during the off state, energy from the inductor to charge a capacitor, the capacitor having a first end electrically coupled to the inductor and a second end electrically coupled to a laser diode. At block 516, the method 500 may include causing, using the gate controller, the switch to enter a second on state for a third amount of time.

The method 500, at block 520, may include discharging, during the second on state, the capacitor. The method 500 may include emitting, using the laser diode, a pulse of light having a defined width at block 524. The emitting of the pulse of light may be based at least in part on the discharging of the capacitor. The pulse of light may additionally or alternatively be based at least in part on the third amount of time. The first amount of time may be between about 2 microseconds and 25 microseconds. The second amount of time may be between about 10 ns and 1000 ns. The third amount of time may be between about 2 ns and 200 ns.

The method 500 may include reducing ringing of the inductor after the emitting of the pulse of light by using a resistor in a branch arranged in parallel the inductor. Additionally or alternatively, the method 500 may include reducing damping associated with charging of the capacitor by using a diode in the branch. The method 500 may include reducing, using one or more capacitors, parasitic inductance of the inductor. The one or more capacitors may include a second capacitor arranged in parallel with the energy storage capacitance. The method 500 may include reducing a fall time of the laser pulse and/or reducing parasitic inductance by using at least one resistor arranged in series with the laser diode and the capacitor. The gate controller may be configured to control lengths of the first, second, and/or third amounts of time.

In some embodiments, the methods, techniques, microprocessors, and/or controllers described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination thereof. The instructions can reside in RAM memory, flash memory, ROM memory, EPROM memory, EEPROM memory, registers, hard disk, a removable disk, a CD-ROM, or any other form of a non-transitory computer-readable storage medium. Such special-purpose computing devices may also combine custom hard-wired logic, ASICs, or FPGAs with custom programming to accomplish the techniques. The special-purpose computing devices may be desktop computer systems, server computer systems, portable computer systems, handheld devices, networking devices or any other device or combination of devices that incorporate hard-wired and/or program logic to implement the techniques.

The microprocessors or controllers described herein can be coordinated by operating system software, such as iOS, Android, Chrome OS, Windows XP, Windows Vista, Windows 7, Windows 8, Windows 10, Windows Server, Windows CE, Unix, Linux, SunOS, Solaris, macOS, Blackberry OS, VxWorks, or other compatible operating systems. In other embodiments, the computing device may be controlled by a proprietary operating system. Conventional operating systems control and schedule computer processes for execution, perform memory management, provide file system, networking, I/O services, and provide a user interface functionality, such as a graphical user interface ("GUI"), among other things.

The microprocessors and/or controllers described herein may implement the techniques described herein using customized hard-wired logic, one or more ASICs or FPGAs, firmware and/or program logic which causes microprocessors and/or controllers to be a special-purpose machine. According to one embodiment, parts of the techniques disclosed herein are performed a controller in response to executing one or more sequences instructions contained in a memory. Such instructions may be read into the memory from another storage medium, such as storage device. Execution of the sequences of instructions contained in the memory causes the processor or controller to perform the process steps described herein. In alternative embodiments, hard-wired circuitry may be used in place of or in combination with software instructions.

Moreover, the various illustrative logical blocks and modules described in connection with the embodiments disclosed herein can be implemented or performed by a machine, such as a processor device, a digital signal processor (DSP), an ASIC, an FPGA or other programmable logic device, discrete gate or transistor logic, discrete hardware components, or any combination thereof designed to perform the functions described herein. A processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the techniques described herein may be implemented in analog circuitry or mixed analog and digital circuitry.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected," as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a range of measurement error.

Although this disclosure contains certain embodiments and examples, it will be understood by those skilled in the art that the scope extends beyond the specifically disclosed embodiments to other alternative embodiments and/or uses and obvious modifications and equivalents thereof. In addition, while several variations of the embodiments have been shown and described in detail, other modifications will be readily apparent to those of skill in the art based upon this disclosure. It is also contemplated that various combinations or sub-combinations of the specific features and aspects of the embodiments may be made and still fall within the scope of this disclosure. It should be understood that various features and aspects of the disclosed embodiments can be combined with, or substituted for, one another in order to form varying modes of the embodiments. Any methods disclosed herein need not be performed in the order recited. Thus, it is intended that the scope should not be limited by the particular embodiments described above.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. Any headings used herein are for the convenience of the reader only and are not meant to limit the scope.

Further, while the devices, systems, and methods described herein may be susceptible to various modifications and alternative forms, specific examples thereof have been shown in the drawings and are herein described in detail. It should be understood, however, that the disclosure is not to be limited to the particular forms or methods disclosed, but, to the contrary, this disclosure covers all modifications, equivalents, and alternatives falling within the spirit and scope of the various implementations described. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication.

The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including ambient temperature and pressure.

What is claimed is:

1. An electronic laser driver for producing a pulsed electrical discharge, the laser driver comprising:
    a voltage source;
    an inductor having first and second ends, the inductor being in electrical communication with the voltage source at the first end of the inductor;
    a first capacitor having first and second ends, the first capacitor being in electrical communication with the second end of the inductor at the first end of the first capacitor;
    a laser diode having first and second ends, the laser diode being in electrical communication with the second end of the first capacitor at the first end of the laser diode, the second end of the laser diode being in electrical communication with ground;
    an electronic switch having a first end connected to a first node disposed between the second end of the inductor and the first end of the first capacitor, wherein the electronic switch is configured to alternate between an on state and an off state;
    a second capacitor having: (i) a first end connected to a second node disposed between the voltage source and the first end of the inductor; and (ii) a second end connected to ground;
    a first resistor having a first end in electrical communication with a third node disposed between the second end of the first capacitor and the first end of the laser diode; and
    a third capacitor, wherein each of the first capacitor and the third capacitor is arranged in parallel with each other between the first node and a fourth node, and is in electrical communication with the laser diode at the fourth node;
    wherein:
        in a first on state, current flows through the electronic switch and the inductor to store energy in the inductor;
        in a first off state, the inductor releases the stored energy and current flows to the first capacitor to charge the first capacitor; and
        in a second on state, the first capacitor discharges and current flows to the laser diode to cause the laser diode to emit light energy.

2. The laser driver of claim 1, further comprising a diode having a first end connected to a fifth node disposed between the second end of the first capacitor and the first end of the laser diode.

3. The laser driver of claim 2, wherein the diode comprises a Schottky diode.

4. The laser driver of claim 1, further comprising a plurality of resistors arranged in parallel with each other between a sixth node and a seventh node, the sixth node being disposed between the second end of the first capacitor and the plurality of resistors, the seventh node being disposed between the first end of the laser diode and the plurality of resistors.

5. The laser driver of claim 1, further comprising an electrical combination arranged in parallel with the inductor between an eighth node and a ninth node, the eighth node being disposed between the voltage source and the inductor, the ninth node being disposed between the first capacitor and the inductor.

6. The laser driver of claim 5, wherein the electrical combination comprises:
    a second resistor configured to reduce ringing of the inductor; and
    a second diode configured to reduce damping associated with charging the first capacitor.

7. The laser driver of claim 1, wherein the electronic switch is configured to be in the first on state for between about 1 microsecond and 10 microseconds.

8. The laser driver of claim 1, wherein the electronic switch is configured to be in the first off state for between about 10 ns and 1000 ns.

9. The laser driver of claim 1, wherein the electronic switch is configured to be in the second on state for between about 5 ns and 100 ns.

10. The laser driver of claim 1, wherein the laser driver is configured to cause the laser diode to emit a pulse of light having a width of less than 50 ns.

11. The laser driver of claim 1, further comprising a gate controller in electrical communication with a second end of the electronic switch, a third end of the electronic switch being in electrical communication with ground.

12. The laser driver of claim 11, wherein the gate controller is configured to control when the electronic switch enters the first on state, the first off state, and the second on state.

* * * * *